US007592842B2

(12) United States Patent
Masleid

(10) Patent No.: US 7,592,842 B2
(45) Date of Patent: Sep. 22, 2009

(54) CONFIGURABLE DELAY CHAIN WITH STACKED INVERTER DELAY ELEMENTS

(76) Inventor: Robert Paul Masleid, 17266 Eaton La., Monte Sereno, CA (US) 95930

( * ) Notice: Subject to any disclaimer, the term of this patent is extended or adjusted under 35 U.S.C. 154(b) by 0 days.

(21) Appl. No.: 12/002,988

(22) Filed: Dec. 18, 2007

(65) Prior Publication Data

US 2008/0129342 A1   Jun. 5, 2008

Related U.S. Application Data

(63) Continuation of application No. 11/020,746, filed on Dec. 23, 2004, now Pat. No. 7,310,008.

(51) Int. Cl.
*H03H 11/26* (2006.01)
*H03K 19/094* (2006.01)
(52) U.S. Cl. .................. 326/121; 326/119; 326/122; 327/276
(58) Field of Classification Search .............. 326/112, 326/113, 119, 121, 122; 327/149, 161, 263, 327/276, 393, 395
See application file for complete search history.

(56) References Cited

U.S. PATENT DOCUMENTS

| | | |
|---|---|---|
| 3,991,380 A | 11/1976 | Pryor |
| 4,498,021 A | 2/1985 | Uya |
| 4,700,089 A | 10/1987 | Fujii et al. |
| 4,739,252 A | 4/1988 | Malaviya et al. |
| 4,760,279 A | 7/1988 | Saito et al. |
| 5,039,893 A | 8/1991 | Tomisawa |
| 5,128,560 A | 7/1992 | Chern et al. |
| 5,166,555 A | 11/1992 | Kano |
| 5,227,679 A | 7/1993 | Woo |
| 5,264,738 A | 11/1993 | Veendrick et al. |
| 5,297,086 A | 3/1994 | Nasu et al. |
| 5,410,278 A | 4/1995 | Itoh et al. |

(Continued)

FOREIGN PATENT DOCUMENTS

EP   1398639   3/2004

(Continued)

OTHER PUBLICATIONS

Lima T, et al. "Capacitance Coupling Immmune, Transient Sensitive Accelerator for Resistive Interconnect Signals of Subquater Micron ULSI" IEEE Journal of Solid-State Circuits, IEEE Inc. New York, US pp. 531-536, Apr. 1996.

(Continued)

*Primary Examiner*—Daniel D Chang

(57) ABSTRACT

A stacked inverter delay chain. The stacked inverter delay chain includes a plurality of stacked inverter delay elements. A switch circuit is included and is coupled to the stacked inverter delay elements and configured to select at least one of the plurality of stacked inverter delay elements to create a delay signal path. The delay signal path has an amount of delay in accordance with a number of stacked inverter delay elements comprising the delay signal path. An input is coupled to a first stacked inverter delay element of the delay signal path to receive an input signal and an output is coupled to the switch circuit and is coupled to the delay signal path to receive a delayed version of the input signal after propagating through the delay signal path.

24 Claims, 5 Drawing Sheets

U.S. PATENT DOCUMENTS

| | | |
|---|---|---|
| 5,414,312 A | 5/1995 | Wong |
| 5,455,521 A | 10/1995 | Dobbelaere |
| 5,467,038 A | 11/1995 | Motley et al. |
| 5,497,105 A | 3/1996 | Oh et al. |
| 5,525,616 A | 6/1996 | Platt et al. |
| 5,568,103 A | 10/1996 | Nakashima et al. |
| 5,587,665 A | 12/1996 | Jiang |
| 5,594,360 A | 1/1997 | Wojciechowski |
| 5,610,548 A | 3/1997 | Masleid |
| 5,614,845 A | 3/1997 | Masleid |
| 5,656,963 A | 8/1997 | Masleid et al. |
| 5,677,650 A | 10/1997 | Kwasniewski et al. |
| 5,680,359 A | 10/1997 | Jeong |
| 5,698,994 A | 12/1997 | Tsuji |
| 5,739,715 A | 4/1998 | Rawson |
| 5,764,110 A | 6/1998 | Ishibashi |
| 5,767,700 A | 6/1998 | Lee |
| 5,777,501 A | 7/1998 | AbouSeido |
| 5,778,214 A | 7/1998 | Taya et al. |
| 5,791,715 A | 8/1998 | Nebel |
| 5,793,715 A | 8/1998 | Alon et al. |
| 5,796,313 A | 8/1998 | Eitan |
| 5,797,105 A | 8/1998 | Nakaya et al. |
| 5,811,983 A | 9/1998 | Lundberg |
| 5,880,608 A | 3/1999 | Mehta et al. |
| 5,894,419 A | 4/1999 | Galambos et al. |
| 5,926,050 A | 7/1999 | Proebsting |
| 5,963,043 A | 10/1999 | Nassif |
| 5,963,074 A * | 10/1999 | Arkin .......................... 327/276 |
| 5,969,543 A | 10/1999 | Erickson et al. |
| 5,977,763 A | 11/1999 | Loughmiller et al. |
| 5,982,211 A | 11/1999 | Ko |
| 6,011,403 A | 1/2000 | Gillette |
| 6,025,738 A | 2/2000 | Masleid |
| 6,028,490 A | 2/2000 | Komatsu |
| 6,031,403 A | 2/2000 | Gersbach |
| 6,069,506 A | 5/2000 | Miller, Jr. et al. |
| 6,087,886 A | 7/2000 | Ko |
| 6,111,447 A | 8/2000 | Ternullo, Jr. |
| 6,114,840 A | 9/2000 | Farrell et al. |
| 6,127,872 A | 10/2000 | Kumata |
| 6,154,099 A | 11/2000 | Suzuki et al. |
| 6,154,100 A | 11/2000 | Okamoto |
| 6,160,755 A | 12/2000 | Norman et al. |
| 6,172,545 B1 * | 1/2001 | Ishii .......................... 327/276 |
| 6,172,943 B1 | 1/2001 | Yuzuki |
| 6,188,260 B1 | 2/2001 | Stotz et al. |
| 6,198,334 B1 | 3/2001 | Tomobe et al. |
| 6,204,710 B1 | 3/2001 | Goetting et al. |
| 6,229,747 B1 | 5/2001 | Cho et al. |
| 6,242,936 B1 | 6/2001 | Ho et al. |
| 6,242,937 B1 | 6/2001 | Lee et al. |
| 6,262,601 B1 | 7/2001 | Choe et al. |
| 6,275,091 B1 | 8/2001 | Saeki |
| 6,281,706 B1 | 8/2001 | Wert et al. |
| 6,285,230 B1 | 9/2001 | Na |
| 6,294,930 B1 | 9/2001 | Goetting et al. |
| 6,321,282 B1 | 11/2001 | Horowitz et al. |
| 6,323,706 B1 | 11/2001 | Stark et al. |
| 6,366,115 B1 | 4/2002 | DiTommaso |
| 6,407,571 B1 | 6/2002 | Furuya et al. |
| 6,426,641 B1 | 7/2002 | Koch et al. |
| 6,426,652 B1 | 7/2002 | Greenhill et al. |
| 6,455,901 B2 | 9/2002 | Kameyama et al. |
| 6,459,319 B2 | 10/2002 | Sako |
| 6,466,063 B2 | 10/2002 | Chen |
| 6,476,632 B1 | 11/2002 | La Rosa et al. |
| 6,489,796 B2 | 12/2002 | Tomishima |
| 6,535,014 B2 | 3/2003 | Chetlur et al. |
| 6,538,471 B1 | 3/2003 | Stan et al. |
| 6,538,522 B1 | 3/2003 | Aipperspach et al. |
| 6,545,519 B1 | 4/2003 | Carballo |
| 6,570,407 B1 | 5/2003 | Sugisawa et al. |
| 6,573,777 B2 | 6/2003 | Saint-Laurent et al. |
| 6,577,157 B1 | 6/2003 | Cheung et al. |
| 6,577,176 B1 | 6/2003 | Masleid et al. |
| 6,621,318 B1 | 9/2003 | Burr |
| 6,657,504 B1 | 12/2003 | Deal et al. |
| 6,664,837 B1 | 12/2003 | Oh et al. |
| 6,690,242 B2 | 2/2004 | Fang et al. |
| 6,697,929 B1 | 2/2004 | Cherkauer et al. |
| 6,724,214 B2 | 4/2004 | Manna et al. |
| 6,731,140 B2 | 5/2004 | Masleid et al. |
| 6,731,179 B2 | 5/2004 | Abadeer et al. |
| 6,759,863 B2 | 7/2004 | Moore |
| 6,762,638 B2 | 7/2004 | Correale, Jr. et al. |
| 6,762,966 B1 | 7/2004 | LaRosa et al. |
| 6,768,363 B2 | 7/2004 | Yoo et al. |
| 6,774,734 B2 | 8/2004 | Christensen et al. |
| 6,798,230 B1 | 9/2004 | Taylor et al. |
| 6,815,971 B2 | 11/2004 | Wang et al. |
| 6,815,977 B2 | 11/2004 | Sabbavarapu et al. |
| 6,831,494 B1 | 12/2004 | Fu et al. |
| 6,879,200 B2 | 4/2005 | Komura et al. |
| 6,882,172 B1 | 4/2005 | Suzuki et al. |
| 6,885,210 B1 | 4/2005 | Suzuki |
| 6,903,564 B1 | 6/2005 | Suzuki |
| 6,924,669 B2 | 8/2005 | Itoh et al. |
| 7,053,660 B2 | 5/2006 | Itoh et al. |
| 7,053,680 B2 | 5/2006 | Masleid et al. |
| 7,119,580 B2 | 10/2006 | Masleid et al. |
| 7,142,018 B2 | 11/2006 | Masleid et al. |
| 7,173,455 B2 | 2/2007 | Masleid et al. |
| 7,239,170 B2 | 7/2007 | Suen et al. |
| 7,271,638 B2 | 9/2007 | Takai et al. |
| 7,295,041 B1 | 11/2007 | Masleid et al. |
| 7,304,503 B2 | 12/2007 | Masleid et al. |
| 7,336,103 B1 | 2/2008 | Masleid et al. |
| 2001/0000426 A1 | 4/2001 | Sung et al. |
| 2001/0028278 A1 | 10/2001 | Ooishi |
| 2001/0030561 A1 | 10/2001 | Asano et al. |
| 2001/0052623 A1 | 12/2001 | Kameyama et al. |
| 2002/0056016 A1 | 5/2002 | Horowitz et al. |
| 2002/0178415 A1 | 11/2002 | Saraf |
| 2003/0005775 A1 | 1/2003 | Washeleski et al. |
| 2003/0011413 A1 | 1/2003 | Masleid |
| 2003/0042960 A1 * | 3/2003 | Gomm ...................... 327/276 |
| 2003/0057775 A1 | 3/2003 | Yamashita et al. |
| 2003/0160630 A1 | 8/2003 | Earle |
| 2003/0189465 A1 | 10/2003 | Abadeer et al. |
| 2003/0231713 A1 | 12/2003 | Masleid et al. |
| 2004/0104731 A1 | 6/2004 | Vollertsen |
| 2004/0119501 A1 | 6/2004 | Sabbavarapu et al. |
| 2004/0119503 A1 | 6/2004 | Jamshidi et al. |
| 2004/0124900 A1 * | 7/2004 | Brox ......................... 327/277 |
| 2004/0148111 A1 | 7/2004 | Gauthier et al. |
| 2004/0257115 A1 | 12/2004 | Bertram et al. |
| 2005/0184720 A1 | 8/2005 | Bernstein et al. |
| 2005/0212547 A1 | 9/2005 | Suzuki |
| 2005/0248368 A1 | 11/2005 | Bertram et al. |

FOREIGN PATENT DOCUMENTS

| | | |
|---|---|---|
| JP | 03089624 | 4/1991 |
| JP | 04091516 | 3/1992 |
| JP | 06216723 | 8/1994 |

OTHER PUBLICATIONS

Nalamalpu, et al Boosters for Driving Long OnChip Interconnects-Design Issues, Interconnect Synthesis, and Comparision with Repeaters, Jan. 2002, IEEE Transactions on Computer-Aided Design of Integrated Circuits and Systems, vol. 21, No. 1, pp. 50-62 (LEAP-P0329).

Taub, et al., Digital Integrated Electronics, 1977, McGraw-Hill, Inc. pp. 98-100 (LEAP-P0329/330).

Chen, G et al., "DynamicNBTI of p-MOS Transistors and its Impact on MOSFET Scaling" IEE Electron Device Letters, 2002.

Oner et al., "A compact Monitoring Circuit for Real-Time On-Chip Diagnosis of Hot-Carrier Induced Degradation" Microelectronic test structures. Proceedings, IEEE International Conference in Monterey, Ca. Mar. 17, 1997 - Mar. 20, 1997, pp. 72-76.

Peters, Laura. "NBTI: A Growing Threat to Device Reliability," Semiconductor International. Mar. 1, 2004 Http://www. reed-electronics.com/semiconductor/article/CA386329?industryid=3033.

Reddy. V. et al., "Impact of Negative Bias Temperature Instability on Digital Circuit Reliability". 2002 IEE International Reliabilty Physics Symposium Proceedings, Dallas, TX Apr. 7, 2002 - Apr. 11, 2002.

Ryhoei Kaneda, Translation of Japanese Kokai Patent Application No. Hei [1991]-89624, publication date: Apr. 15, 1991, pp. 1-6.

Rhyne, "Fundamentals of Digital Systems Design", N.J. 1973, pp. 70-71.

Stojanovic, V. and Oklobdzija, V., "Comparative Analysis of Master-Slave Latches and Flip-Flops for High-Performance and Low-Power Systems", IEEE Journal of Solid-State Circuits, vol. 34, No. 4, Apr. 1999, pp. 536-548.

Non-Final OA Dated Sep. 19, 2006; U.S. Appl. No. 11/020,746.
Final OA Dated Feb. 23, 2007; U.S. Appl. No. 11/020,746.
Notice of Allowance Dated Jul. 31, 2007; U.S. Appl. No. 11/020,746.
Notice of Allowance Dated Sep. 6, 2007; U.S. Appl. No. 11/020,746.

* cited by examiner

CONFIGURABLE DELAY CHAIN WITH STACKED INVERTER DELAY ELEMENTS

CROSS REFERENCE TO RELATED APPLICATIONS

This Application is a Continuation of U.S. patent application Ser. No. 11/020,746, filed Dec. 23, 2004 now U.S. Pat. No. 7,310,008, entitled "A CONFIGURABLE DELAY CHAIN WITH STACKED INVERTER DELAY ELEMENTS" to Robert P. Masleid, which is hereby incorporated herein by Reference in its entirety.

This Application is related to, and incorporates by reference in their entirety, the following co-pending, commonly assigned U.S. patent applications Ser. No. :

U.S. patent application Ser. No. 11/021,222, filed Dec. 23, 2004, entitled "A CONFIGURABLE TAPERED DELAY CHAIN WITH MULTIPLE SIZES OF DELAY ELEMENTS" by Masleid;

U.S. patent application Ser. No. 11/021,221, filed Dec. 23, 2004, entitled "A CONFIGURABLE DELAY CHAIN WITH SWITCHING CONTROL FOR TAIL DELAY ELEMENTS" by Masleid;

U.S. patent application Ser. No. 11/021,632, filed Dec. 23, 2004, entitled "POWER EFFICIENT MULTIPLEXER" by Masleid;

U.S. patent application Ser. No. 11/021,197, filed Dec. 23, 2004, entitled "LEAKAGE EFFICIENT ANTI-GLITCH FILTER WITH VARIABLE DELAY STAGES" by Masleid; and U.S. patent application Ser. No. 11/021,633, filed Dec. 23, 2004, entitled "LEAKAGE EFFICIENT ANTI-GLITCH FILTER" by Masleid.

TECHNICAL FIELD

The present invention relates to signal timing for digital integrated circuit devices.

BACKGROUND ART

The design and fabrication of high-performance signaling mechanisms for digital integrated circuit devices has become a significant challenge. For example, with respect to high-performance memory integrated circuit devices, ensuring the reliability in the design and fabrication of the signaling components of such devices (e.g., high performance DDR memory) has become problematic. In the past, slower memory bus speeds allowed significant specification margins in the design and fabrication of a given memory module. However, modern memory integrated circuit designs require exacting control of critical timing specifications, and design parameters must be strictly maintained to keep the entire system in balance. A variable signal delay element is a mechanism used to compensate for timing irregularities and calibrate sensitive signaling components. What is needed is an effective variable delay element that provides reliability, speed, and proper timing to insure an overall system (e.g., CPU, bridge components, peripheral busses, etc.) operates at peak performance, while requiring minimal power.

DISCLOSURE OF THE INVENTION

Embodiments of the present invention provide a method and system for a configurable delay chain with leakage efficient stacked inverter delay elements.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE EMBODIMENTS

Figure 1:
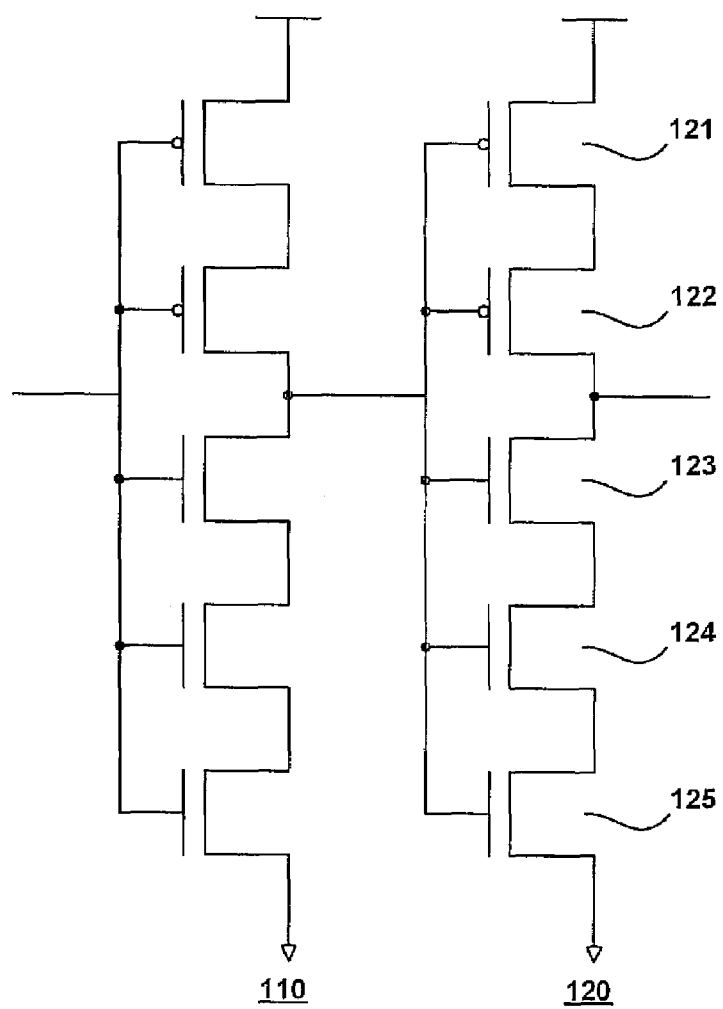
FIG. 1 illustrates a schematic of a stacked inverter delay chain, in accordance with embodiments of the present invention.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

Notation and Nomenclature

Some portions of the detailed descriptions which follow are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "storing" or "accessing" or "recognizing" or "retrieving" or "translating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the Invention

Embodiments of the present invention implement a stacked inverter delay chain having delay elements optimized for minimal leakage current. The stacked inverter delay chain includes a plurality of stacked inverter delay elements. A switch circuit is included and is coupled to the stacked inverter delay elements and configured to select at least one of the plurality of stacked inverter delay elements to create a delay signal path. The delay signal path has an amount of delay in accordance with a number of stacked inverter delay elements comprising the delay signal path. An input is coupled to a first stacked inverter delay element of the delay signal path to receive an input signal and an output is coupled to the switch circuit and is coupled to the delay signal path to receive a delayed version of the input signal after propagating through the delay signal path.

The following description of embodiments in accordance with the present invention is directed toward delay elements having PFETs (or p-type field effect transistors formed in surface N-wells and/or NFETs (or n-type field effect transistors) formed in surface P-wells when a p-type substrate and an N-well process are utilized. It is to be appreciated, however, that embodiments in accordance with the present invention are equally applicable to NFETs formed in surface P-wells and/or PFETs formed in surface N-wells when an n-type substrate and a P-well process are utilized. Consequently, embodiments in accordance with the present invention are well suited to semiconductors formed in both p-type and n-type materials, and such embodiments are considered within the scope of the present invention.

FIG. 1 illustrates a schematic of a novel stacked inverter delay chain 100, in accordance with embodiments of the present invention. Stacked inverter delay chain 100 comprises stacked inverters 110 and 120. The output of stacked inverter 110 is coupled to the input of stacked inverter 120. It is to be appreciated that additional stacked inverter delay chains, e.g., one or more instances of stacked inverter delay chain 100, can be coupled to stacked inverter delay chain 100 to achieve larger signal delay values. Examples of multiple stacked inverter delay chains arranged a large configurable stacked inverter delay system in accordance with embodiments of the present invention are described in the discussion of FIG. 4 below.

In contrast to a conventional inverter, stacked inverters 110 and 120 comprise more than a single p-type device coupled to a single n-type device. Rather, stacked inverters 110 and 120 comprise multiple p-type devices and multiple n-type devices. More particularly, stacked inverter 120 comprises two p-type devices 121 and 122 and three n-type devices 123, 124 and 125. The gates of the devices of stacked inverter 120 are coupled together forming the input of the inverter stage. The output of the inverter stage may be taken at the coupling of a p-type device to an n-type device.

In contrast to a conventional inverter, however, stacked inverter 120 comprises multiple series devices per "leg." For example, two p-type devices are configured to pull the output high (when appropriate) and three n-type devices are configured to pull the output low. Consequently, the drive capability of stacked inverter 120 is less than the drive capability of a conventional inverter. Beneficially, such decreased drive capability produces an increased delay of a signal through stacked inverter 120.

Additionally, and also of benefit, stacked inverter 120 presents an increased load to its driving circuitry, in comparison to a conventional inverter. For example, a signal input to stacked inverter 120 is coupled to five active devices as opposed to being coupled to two active devices in a conventional inverter. Each device presents an input capacitance. Such increased loading produces a further desirable increase in signal propagation delay.

An approximate analysis of stacked inverter delay chain 100 indicates that the delay of stacked inverter 120 is about six times the delay of a conventional two-device inverter. For example, drive resistance of stacked inverter 120 can be about 2.5 times the drive resistance of a conventional inverter, and load capacitance of stacked inverter 120 can be about 2.5 times the load capacitance of a conventional inverter. If stacked inverter 110 is constructed similarly, the delay through stacked inverter delay chain 100 will be about 6 times longer than through a conventional inverter pair. In different terms, a delay through stacked inverter delay chain 100 is approximately the same as a delay through a chain of 12 stages of conventional inverters. It is appreciated that an exact evaluation is the province of circuit simulation and the details of a particular semiconductor manufacturing process.

A chain of 12 conventional inverters comprising 24 active devices has approximately the same delay as stacked inverter delay chain 100 comprising ten active devices. Consequently, the active switching power of stacked inverter delay chain 100 is beneficially reduced to approximately 42 percent (10 divided by 24) of the active switching power of a conventional delay circuit, for about the same delay.

In addition to a reduction in the number of active devices required for a comparable delay, a beneficial reduction is realized in integrated circuit die area required by stacked inverter delay chain 100. As a consequence of utilizing fewer active components than a conventional delay circuit, stacked inverter delay chain 100 comprises about 42 percent of the die area for active devices versus a conventional delay circuit, for approximately the same delay. However, there is yet another additional integrated circuit die area benefit realized by stacked inverter delay chain 100 over the conventional art.

Figure 2:
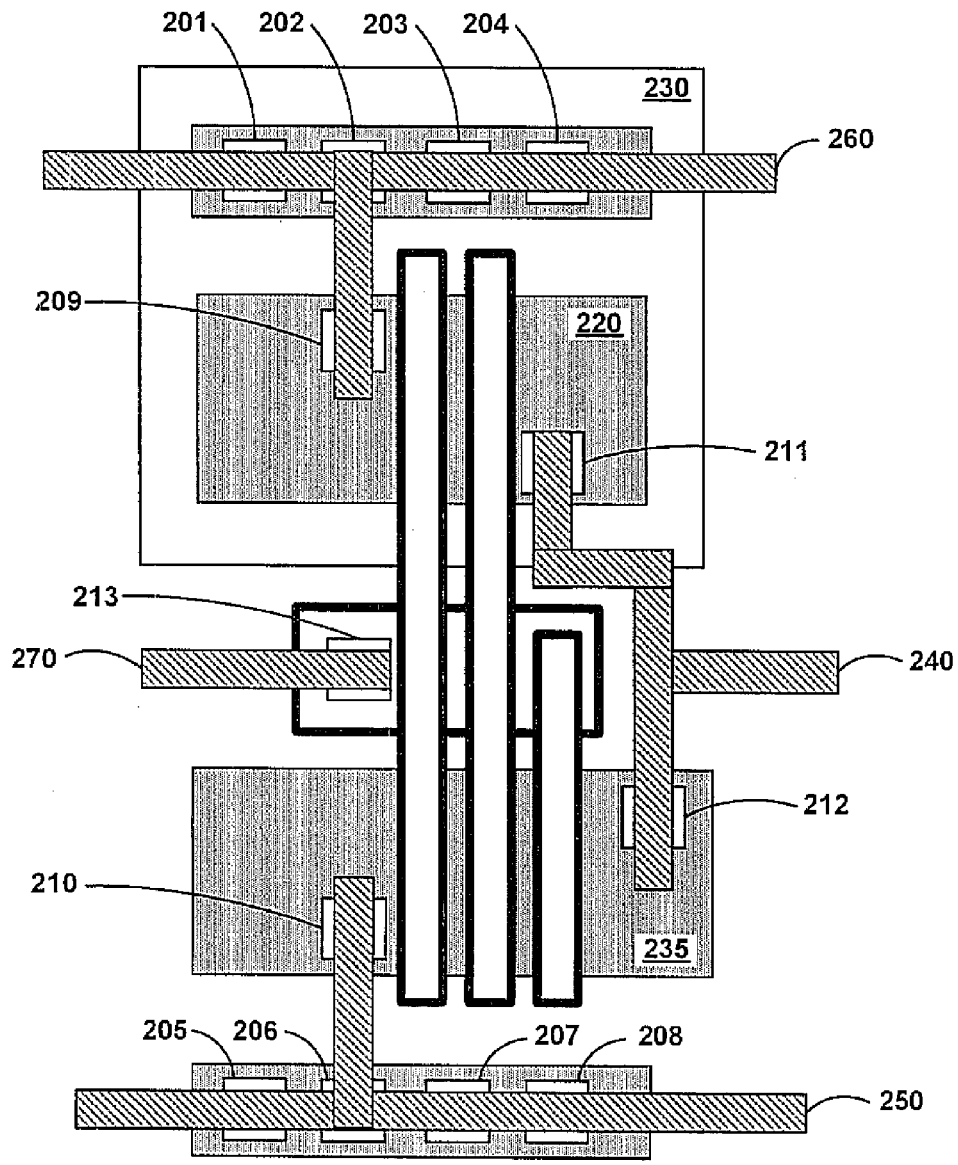
FIG. 2 illustrates an exemplary layout of a stacked inverter, in accordance with embodiments of the present invention.

FIG. 2 illustrates an exemplary layout of stacked inverter 120, in accordance with embodiments of the present invention. It is appreciated that FIG. 2 is not drawn to scale.

Stacked inverter 120 comprises two p-type devices (121, 122 of FIG. 1) formed in p-type diffusion within n-well 220. Stacked inverter 120 comprises three n-type devices (123, 124, 125 of FIG. 1) formed in n-type diffusion. Metallization 240 couples p-type diffusion 220 with n-type diffusion 235, coupling p-type device 122 (FIG. 1) with n-type device 123 (FIG. 1) and forming the output of stacked inverter 120 (FIG. 1).

Metallization 260 couples p-type device 121 (FIG. 1) to an operating voltage, e.g., Vdd. Metallization 250 couples n-type device 125 (FIG. 1) to ground. Metallization 270 couples an input signal to the gates of all devices.

In a conventional art delay circuit, all diffusion regions require a contact. For example, in the conventional art, contacts are required to connect a transistor to a later stage and/or to connect a transistor to a transistor of opposite type. Thus, a conventional art inverter chain requires about 5 contacts per stage. For example, a conventional art inverter stage would typically comprise one contact to couple Vdd to the p-type device, one contact to couple ground to the n-type device, one contact to couple the inverter output to the p-type device, one to couple the inverter output to the n-type device and one contact for the input. Twelve stages of inverters thus require about 60 contacts. It is appreciated that additional contacts are generally required for coupling Vdd and ground to the wells.

In contrast, in accordance with embodiments of the present invention, stacked inverter delay chain 100 requires far fewer contacts to produce about the same delay as a conventional 12-stage inverter delay chain. In contrast to the conventional art, stacked inverter 120 has no need of contacts within its stacks. For example, no contact is necessary between p-type devices 121 and 122 (FIG. 1), nor is a contact necessary between n-type devices 123 and 124 (FIG. 1), nor is a contact necessary between n-type devices 124 and 125 (FIG. 1). For example, one contact couples p-type device 121 (FIG. 1) to Vdd (contact 209), and one contact couples n-type device 125 (FIG. 1) to ground (contact 210). One contact couples p-type device 122 (FIG. 1) to the output (contact 211), and one contact couples n-type device 123 (FIG. 1) to the output (contact 212). One contact couples the input to all devices (contact 213). Consequently, stacked inverter 120 can be constructed utilizing a total of about five contacts. Exemplary contacts 201-208 are illustrated coupling Vdd and ground to the wells. It is appreciated that such contacts are commonly interspersed at intervals, e.g., every tenth row of logic, and thus may not be strongly associated with a particular circuit.

Therefore, in contrast to a conventional art inverter delay chain requiring about 60 contacts, stacked inverter delay chain 100 requires only about 10 contacts, or one sixth as many contacts to produce about the same delay. Consequently, embodiments in accordance with the present invention yield highly advantageous integrated circuit die area reductions far beyond a reduction in transistor count.

A further benefit of stacked inverter delay chain 100 derives from utilizing fewer stages in comparison to the conventional art. Consequently, embodiments in accordance with the present invention require less wiring to intercouple stages and fewer inter-stage spaces to separate stages. Such requirements for less wiring and less space result in a desirable reduction in integrated circuit die area required for such wiring and spaces.

It is to be appreciated that static power consumption in modern semiconductor processes, e.g., processes with a minimum feature size of about 0.13 microns and smaller, is no longer a negligible component of total power consumption. For such processes, static power may be one-half of total power consumption. Further, static power, as a percentage of total power, is tending to increase with successive generations of semiconductor process.

Embodiments in accordance with the present invention offer significant advantages in reducing static power consumption in comparison with the conventional art. A conventional art inverter delay chain comprises a leakage path for each inverter, e.g., a series "string" of devices from operating voltage (Vdd) to ground. Thus, a 12 inverter delay chain comprises 12 leakage paths. In contrast, stacked inverter delay chain 100 comprises just two leakage paths. Consequently, stacked inverter delay chain 100 comprises one sixth of the leakage paths.

Further, such leakage paths within stacked inverter delay chain 100 suffer less leakage than conventional inverters, yielding additional beneficial leakage reductions. In a conventional inverter, exactly one transistor is on while the other transistor is off. As an unfortunate consequence, approximately the full bias voltage is applied to the off transistor, resulting in a maximum possible leakage for the off transistor.

In contrast, referring once again to FIG. 1, in stacked inverter 120 multiple transistors are either on or off in series. For example, for a "high" output state, transistors 121 and 122 are on, while transistors 123, 124 and 125 are off. Consequently, each off transistor (123-125) has significantly less than full bias voltage applied. For example, for a high output, each transistor 123, 124 and 125 will have about one third of full bias voltage applied. It is appreciated that leakage current generally decreases exponentially as voltage decreases. For example, a two times reduction in off bias voltage produces about an eight times reduction in leakage current per leakage path.

It is to be further appreciated that such leakage induces non zero voltages at intermediate nodes between the off transistors, e.g., between transistors 125 and 124, and between transistors 124 and 123. Such voltages induce body effects in the transistors. Such body effects increase the threshold voltage of the affected transistors. An increased threshold voltage generally produces beneficial decreases in leakage current.

Consequently, in addition to a decrease in a number of leakage paths, in accordance with embodiments of the present invention, the leakage current of each path is very beneficially reduced due to an induced body effect and a highly non-linear relationship between bias voltage and leakage current. An approximate analysis indicates that total leakage current of stacked inverter delay chain 100 is reduced about 50 times in comparison to a conventional delay chain of inverters, for the same delay.

Another aspect of merit regarding delay circuits is the ability of a delay circuit to track speed changes of other circuitry of an integrated circuit. It is appreciated that a variety of factors, e.g., operating voltage, operating temperature and/or manufacturing process variations, can affect the speed of operation of an integrated circuit. It is generally desirable for a delay circuit to track speed changes of other circuitry of an integrated circuit. For example, if other circuits of an integrated circuit operate faster, generally less absolute delay is required from a delay circuit for the overall circuit to function. Because embodiments in accordance with the present invention comprise stacked devices, they are similar to many logic circuits that also comprise stacked devices, e.g., NAND and/or NOR logic gates. Consequently, embodiments in accordance with the present invention match or track changes in operating speed of complex logic more accurately than delay chains comprising very simple inverters.

Embodiments in accordance with the present invention are thus shown to offer significant and highly beneficial improvements in tracking timing changes of other circuits, integrated circuit die area, active power consumption and static power (leakage current) consumption in comparison to the conventional art.

Figure 3:
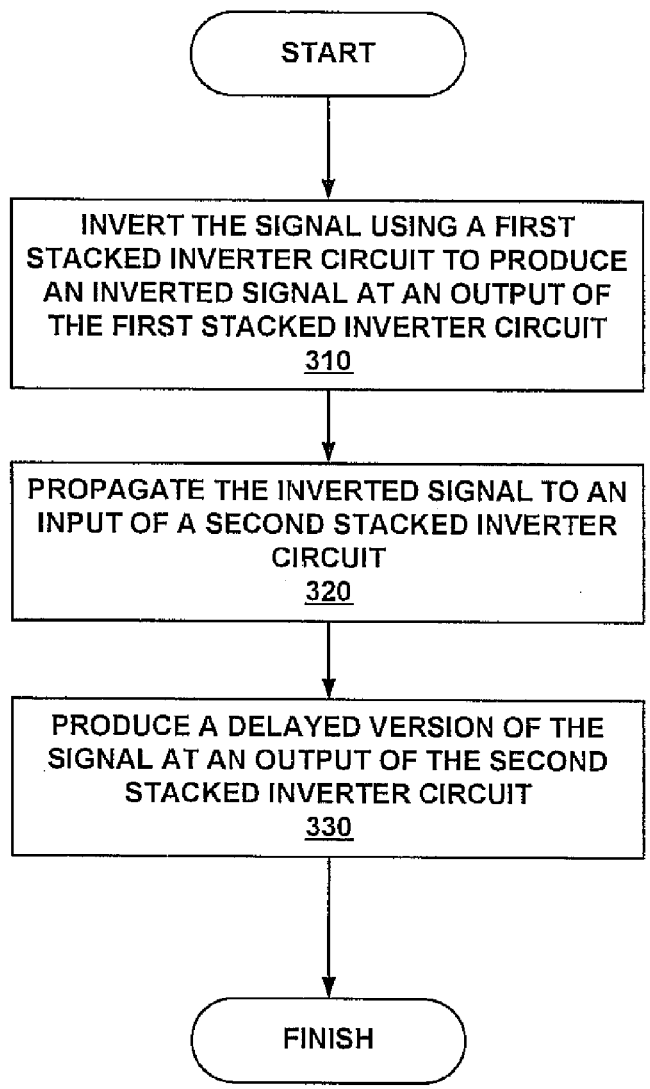
FIG. 3 illustrates a flow chart of steps in a method of delaying a signal, in accordance with embodiments of the present invention.

FIG. 3 illustrates a flow chart of steps in a method of delaying a signal 300, in accordance with embodiments of the present invention. In block 310, the signal is inverted using a first stacked inverter circuit to produce an inverted signal at an output of the first stacked inverter circuit. For example, the inverted signal is the output of stacked inverter chain 110 of FIG. 1.

In block 320, the inverted signal is propagated to an input of a second stacked inverter circuit, e.g., at the input of stacked inverter chain 120 of FIG. 1. In block 330, a delayed version of the signal is produced at an output of the second stacked inverter circuit. For example, in reference to FIG. 1, a delayed version of the input to stacked inverter circuit 110 is produced at the output of stacked inverter chain 110. In accordance with embodiments of the present invention, the first and the second stacked inverter circuits comprise at least five active devices.

It is to be appreciated physical differences between electrons and holes, and between n-type and p-type dopants, as well as constructive differences in device geometry and dopant placement, result in differences in efficiency between n-type devices and p-type devices. Because electron mobility is higher than hole mobility, n-type devices are more efficient than p-type devices. However, the degree of difference depends on constructive differences that can vary with process. Such physical and constructive differences also produce other behavior differences, such as a difference in sensitivity to body effects. Consequently, different levels of benefit, e.g., in leakage reduction, are to be expected between stacks of n-type devices and stacks of p-type devices. To allow for such effects, in accordance with embodiments of the present invention, it is possible to stack different numbers of transistors on either or both legs of a stacked inverter. Such variations allow increases in load and/or decreases in drive capability, enabling a wide variety of delay values, as well as enabling differing body effects.

For example, depending upon a wide variety of factors, including, e.g., details of a semiconductor process, required delay, active power budget and/or static power budget, a delay circuit comprising multiple stacked inverter circuits, each comprising three or more p-type devices in conjunction with three or more n-type devices, may better optimize available resources than stacked inverter delay circuit 100 (FIG. 1).

It is to be appreciated that conventional integrated circuit design practice generally teaches away from embodiments in accordance with the present invention. For example, much of the art generally teaches design of "fast" circuits. In most areas of integrated circuit design, a great deal of effort is devoted to design details that contribute to an increased speed (frequency) of operation, e.g., reducing input capacitance and increasing output drive. For example, in contrast to conventional teaching and practice, stacked inverter chain 120 comprises stacked transistors without an intermediate buffer, reducing output drive capability and slowing the circuit down. Further, stacked inverter chain 120 comprises multiple inputs that all have the same logical purpose, increasing input capacitance and further slowing the circuit down.

Further, embodiments in accordance with the present invention are contrary to the operation of conventional integrated circuit design tools. For example, conventional design synthesis tools will routinely "optimize" redundancy out of a design. For example, stacked inverter 120 (FIG. 1) comprises two field effect transistors in series driven by the same input. From a logic design perspective, such a structure may be considered redundant. Thus, conventional design synthesis tools will routinely reduce stacked inverter 120 to a conventional two-device inverter. Consequently, a designer may be required to take custom efforts to retain and embody a novel stacked inverter in accordance with embodiments of the present invention when utilizing conventional design tools.

Embodiments in accordance with the present invention provide a stacked inverter comprising desirable delay, die area and power characteristics. Further embodiments in accordance with the present invention provide for coupling two stacked inverters together to form a stacked inverter delay chain that is more efficient in terms of die area, active and passive power consumption than conventional delay chains comprising conventional inverters. Still further embodiments in accordance with the present invention provide for stacks of varying numbers of devices per leg of a stacked inverter.

Additional descriptions of stacked inverter delay elements can be found in commonly assigned U.S. patent application "STACKED INVERTER DELAY CHAIN" by Masleid et al., filed on Jun. 8, 2004, application Ser. No. 10/864,271, which is incorporated herein in its entirety.

Figure 4:
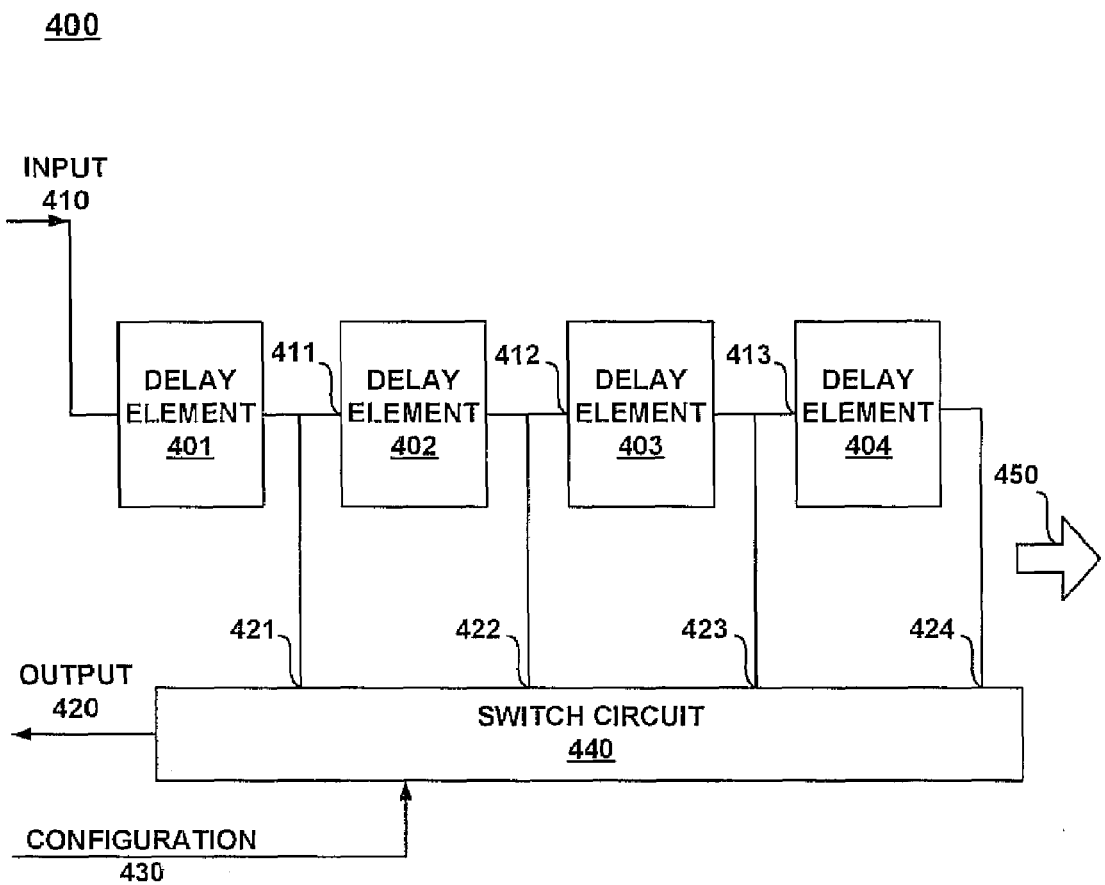
FIG. 4 shows a configurable stacked inverter delay chain in accordance with one embodiment of the present invention.

Referring now to FIG. 4, a configurable stacked inverter delay chain 400 in accordance with one embodiment of the present invention is shown. As depicted in FIG. 4, the delay chain 400 includes a plurality of stacked inverter delay elements 401-404. The stacked inverter delay elements 401-404 are coupled in series as shown. Each of the stacked inverter delay elements, referred to hereafter as delay elements, 401-404 is coupled to a switch circuit 440 as shown. The switch circuit 440 includes an output 420 for providing the resulting output signal 420 to, for example, other external circuits.

Figure 5:
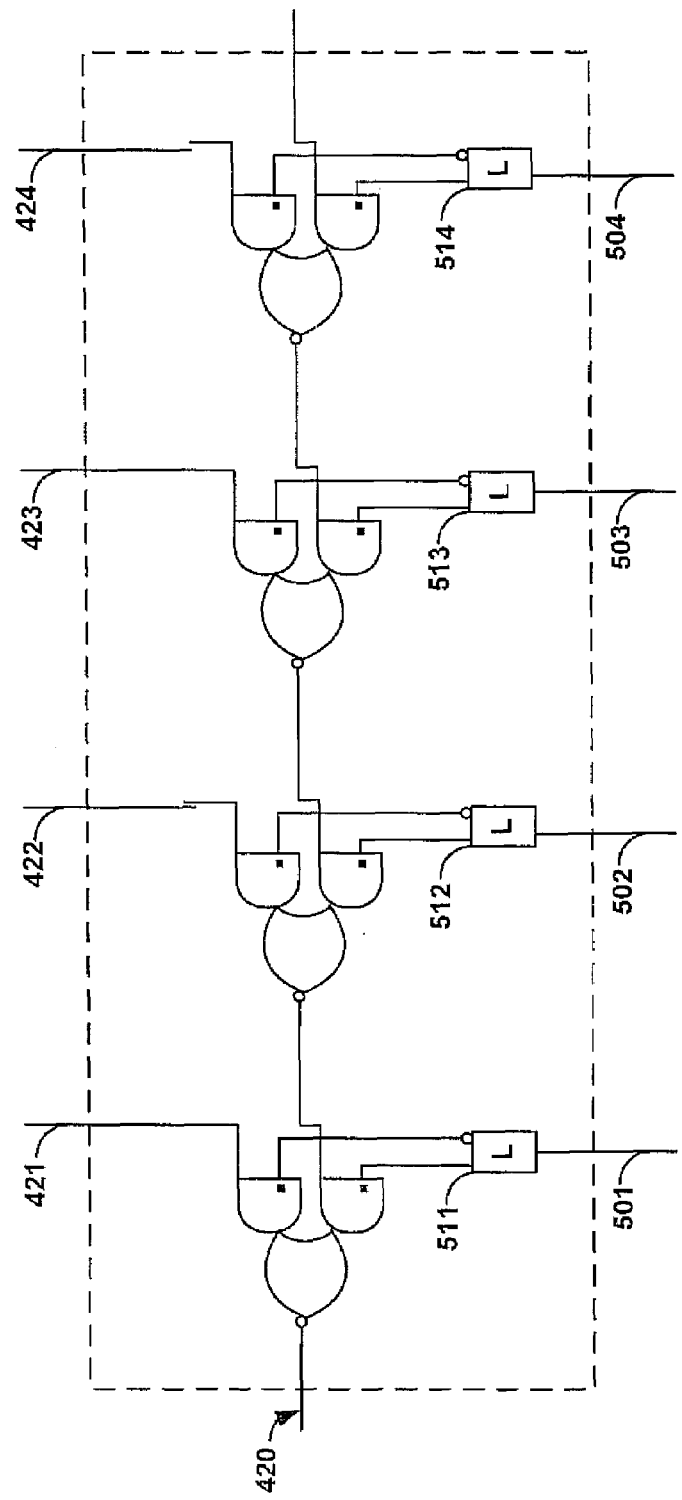
FIG. 5 shows a diagram depicting the internal components of a switch circuit in accordance with one embodiment of the present invention.

In the present embodiment, each of the delay elements 401-404 comprises a leakage efficient stacked inverter delay chain of the configuration described above (e.g., in the discussion FIG. 1). A delay element can comprise a single stacked inverter (e.g., stacked inverter 110) or multiple stacked inverters (e.g., the two stacked inverters 110 and 120 comprising stacked inverter chain 100). It should be noted that, depending upon the particular requirements of a given application, differing numbers of stacked inverters (e.g., one or more instances of stacked inverter 110, stacked inverter 120, etc.), can be arranged to comprise a delay element. Additionally, it should be noted that depending upon the number of stacked inverters per delay element, the signal emerging from one delay element to the next delay element will be inverted (e.g., for an odd number of inverter(s) per delay element) or un-inverted (e.g., for an even number of inverters per delay element), and this signal attribute needs to be appropriately handled in the output circuitry (e.g., the switch circuit 440 as shown in FIG. 5 below). Accordingly, the configurable stacked inverter delay chain 400 provides substantial benefits with regard to tracking timing changes of other circuits, integrated circuit die area, active power consumption and static power (e.g., leakage current) consumption in comparison to the conventional art.

The switch circuit 440 is coupled to the delay elements 401-404 and is configured to select at least one of the plurality of delay elements 401-404 to create a delay signal path having an amount of delay in accordance with a number of stacked inverter delay elements comprising the delay signal path. For example, to implement a resulting output signal 420 having the smallest amount of delay, the switch circuit 440 would implement a delay signal path including only the first delay element 401. The input signal 410 would propagate to the first delay element 401 and incur an amount of delay in accordance with the devices of the first delay element 401 (e.g., as depicted in delay chain 100 of FIG. 1). The signal emerging from the first delay element 401 is selected by a tap 421 of the switch circuit 440. The signal is coupled to the output 420 by the switch circuit 440 as the resulting delayed output signal 420.

To implement a resulting output signal 420 having a larger amount of delay, the switch circuit 440 implements a delay signal path including an additional number of the delay elements. For example, the amount of delay added to the input signal 410 can be substantially doubled by selecting tap 422 of the switch circuit. This causes the input signal 410 to propagate through the delay element 401 to the input 411 of delay element 402 and through delay element 402 before being picked up by the tap 422. Thus, the resulting output signal 420 will have an added amount of delay including the delay from elements 401 and 402.

In this manner, the switch circuit 440 is configured to implement a configurable, adjustable delay signal path by selecting the appropriate one of the taps 421-424. The switch circuit 440 adjusts the delay signal path by switching delay elements into or out of the delay signal path via one of the taps 421-424. In the present embodiment, the output of the prior delay element is coupled to the input of a subsequent delay element (e.g., inputs 411-413) via a substantially direct connection.

In the present embodiment, the desired amount of delay is implemented via a configuration input 430 for the switch circuit 440. For example, depending upon the particular requirements of a given application, the configuration input 430 can set the switch circuit 440 to increase the delay amount, decrease the delay amount, keep the same delay amount, or the like. Although four delay elements 401-404 are shown, it should be noted that a larger number of delay elements can be included within the configurable stacked delay element chain 400 to give a larger range of adjustable delay. This is shown in FIG. 4 by the arrow 450. Similarly, fewer delay elements (e.g., two) can be used for those applications requiring a small range of adjustable delay.

The adjustable delay capabilities of embodiments of the present invention can be advantageously used in a number of different applications. For example, in a high-performance memory application (e.g., DDR DRAMs) sampling windows correspond to the rising and falling edges of the strobe signals can be accurately placed at the center of the stringent rise-and-hold times. Additionally, for example, in high-speed signaling applications the rising and falling edges of multiple data signals can be accurately aligned with nanosecond accuracy (e.g., 1.875 nanoseconds for DDR II 533 DRAM).

FIG. 5 shows a diagram depicting the internal components of the switch circuit 440 in accordance with one embodiment of the present invention. As shown in FIG. 5, each of the taps 421-424 is activated or deactivated by its associated logic. The logic is set up via associated respective configuration bits stored within respective storage elements (e.g., flops) 511-514. In the switch circuit 440 embodiment, the first one of the storage elements 511-514 storing a logic zero results in its correspond tap being selected (e.g., from left to right). For example, in the switch circuit 440 embodiment, if the first through the "Nth" storage elements are 1 (e.g., from left to right), and the N+1 storage element is zero, the corresponding N+1 tap is selected.

In one embodiment, the storage elements 511-514 are accessed via their respective inputs 501-504. The inputs 501-504 thus comprise the configuration input 430 shown in FIG. 4, and can be accessed in parallel. In an alternative embodiment, the configuration bits can be shifted into the storage elements serially (e.g., from left to right from element 511 to 514).

It should be noted that the switch circuit 440 embodiment of FIG. 5 depicts a configuration where there is either one stacked inverter or an odd number of stacked inverters comprising each delay element. As described above, depending upon the number of stacked inverters per delay element, the signal emerging from one delay element to the next delay element will be inverted (e.g., for an odd number of inverter(s) per delay element) or un-inverted (for an even number of inverters per delay element). The logic of the switch circuit 440 embodiment is configured for an odd number of stacked inverters, whereby the inversion is properly handled by the depicted NOR gates. However, for example, for an even number of inverters per delay element, the NOR gates would be replaced by OR gates.

The foregoing descriptions of specific embodiments of the present invention have been presented for purposes of illustration and description.

They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of delaying a signal comprising:
    selecting at least one of a plurality of stacked inverter delay elements using a switch circuit to create a delay signal path, wherein each stacked inverter delay element includes a greater number of n-type devices than p-type devices;
    coupling an input signal to a first stacked inverter delay element of the delay signal path;
    propagating the input signal through the delay signal path; and
    receiving a resulting output signal from a last stacked inverter delay element of the delay signal path such that the resulting output signal is a delayed version of the input signal.

2. The method of claim 1 wherein each of the plurality of stacked inverter delay elements comprise at least five active devices.

3. The method of claim 1 wherein said first stacked inverter circuit comprises two p-type devices and three n-type devices.

4. The method of claim 1 wherein the switch circuit is configured to adjust an amount of delay for the delay signal path by adjusting a number of the plurality of stacked inverter delay elements in the delay signal path.

5. The method of claim 1 wherein each of the plurality of stacked inverter delay elements is configured to add an incremental amount of delay to the input signal when switched into the delay signal path by the switch circuit.

6. The method of claim 1 wherein the input signal propagates from the first stacked inverter delay element to a subsequent stacked inverter delay element using a substantially direct connection.

7. The method of claim 1 wherein the switch circuit is configured to store a plurality of configuration bits to select a number of stacked inverter delay elements comprising the delay signal path.

8. The method of claim 7 wherein an amount of delay added to the input signal is adjustable in accordance with setting the configuration bits in the switch circuit.

9. A stacked inverter delay chain, comprising:
    a plurality of stacked inverter delay elements, each stacked inverter delay element including a greater number of n-type devices than p-type devices;
    a switch circuit coupled to the stacked inverter delay elements and configured to select at least one of the plurality of stacked inverter delay elements to create a delay signal path having an amount of delay in accordance with a number of stacked inverter delay elements comprising the delay signal path;
    an input coupled to a first stacked inverter delay element of the delay signal path to receive an input signal; and an output coupled to the switch circuit, wherein the output is coupled to the delay signal path to receive a delayed version of the input signal after propagating through the delay signal path.

10. The stacked inverter delay chain of claim 9, wherein each of the stacked inverter delay elements further comprises:
a first plurality of devices of p-type coupled in series;
a second plurality of devices of n-type coupled in series; and
wherein said first and said second pluralities of devices are coupled in series and comprise at least five active devices.

11. The stacked inverter delay chain of claim 10 wherein said first plurality of devices comprises two p-type devices.

12. The stacked inverter delay chain of claim 11 wherein said second plurality of devices of an opposite type comprises three n-type devices.

13. The stacked inverter delay chain of claim 10 wherein each of the plurality of stacked inverter delay elements are configured for a lower leakage current than an inverter comprising only two active devices.

14. The stacked inverter delay chain of claim 10 wherein a gate of each of the plurality of stacked inverter delay elements is coupled to receive the input signal.

15. The stacked inverter delay chain of claim 10 wherein the switch circuit is configured to adjust an amount of delay for the delay signal path by adjusting a number of the plurality of stacked inverter delay elements in the delay signal path.

16. The stacked inverter delay chain of claim 10 wherein each of the plurality of stacked inverter delay elements is configured to add an incremental amount of delay to the input signal when switched into the delay signal path by the switch circuit.

17. The stacked inverter delay chain of claim 10 wherein the input signal propagates from the first stacked inverter delay element to a subsequent stacked inverter delay element using a substantially direct connection.

18. The stacked inverter delay chain of claim 10 wherein the switch circuit is configured to store a plurality of configuration bits to select a number of stacked inverter delay elements comprising the delay signal path.

19. The stacked inverter delay chain of claim 18 wherein an amount of delay added to the input signal is adjustable in accordance with the setting of the configuration bits in the switch circuit.

20. A stacked inverter delay chain comprising:
a plurality of stacked inverter delay elements, wherein each stacked inverter delay element comprises:
two stacked inverter circuits coupled in series, each of said stacked inverter circuits comprising:
at least two p-type devices coupled in series; and
at least three n-type devices coupled in series, wherein each stacked inverter delay element incorporates a greater number of n-type devices than p-type devices;
a switch circuit coupled to the stacked inverter delay elements and configured to select at least one of the plurality of stacked inverter delay elements to create a delay signal path having an amount of delay in accordance with a number of stacked inverter delay elements comprising the delay signal path;
an input coupled to a first stacked inverter delay element of the delay signal path to receive an input signal; and
an output coupled to the switch circuit, wherein the output is coupled to the delay signal path to receive a delayed version of the input signal after propagating through the delay signal path.

21. The stacked inverter delay chain of claim 20 wherein the two stacked inverter circuits are substantially identical.

22. The stacked inverter delay chain of claim 21 wherein each of the stacked inverter circuits comprises two p-type devices.

23. The stacked inverter delay chain of claim 20 wherein a gate of all devices of each stacked inverter delay element is coupled to the input signal.

24. The stacked inverter delay chain of claim 20 wherein each stacked inverter delay element comprises:
a first p-type device comprising a first terminal coupled to an operating voltage;
a second p-type device comprising a first terminal coupled to a second terminal of said first device;
a third n-type device type comprising a first terminal coupled to a second terminal of said second device;
a fourth n-type device type comprising a first terminal coupled to a second terminal of said third device;
a fifth n-type device comprising a first terminal coupled to a second terminal of said fourth device;
said fifth n-type device further comprising a second terminal coupled to a ground reference of said integrated circuit, wherein third terminals of said first, second, third, fourth and fifth devices are coupled together forming an input to said integrated circuit; and
an output of said integrated circuit coupled to said second terminal of said second p-type device.

* * * * *